United States Patent

Bertolet et al.

[11] Patent Number: 6,025,744
[45] Date of Patent: Feb. 15, 2000

[54] GLITCH FREE DELAY LINE MULTIPLEXING TECHNIQUE

[75] Inventors: Allan R. Bertolet, Williston; Albert M. Chu; Frank D. Ferraiolo, both of Essex; Samuel K. Weinstein, Winooski, all of Vt.

[73] Assignee: International Business Machines Corporation, Armonk, N.Y.

[21] Appl. No.: 09/062,415

[22] Filed: Apr. 17, 1998

[51] Int. Cl.[7] .................................................. H03H 11/26
[52] U.S. Cl. .......................................... 327/276; 327/291
[58] Field of Search .................................... 327/231, 233, 327/235, 237, 250, 251, 261, 269, 270, 271, 276, 277, 284, 291, 299

[56] References Cited

U.S. PATENT DOCUMENTS

| | | | |
|---|---|---|---|
| 5,087,842 | 2/1992 | Pulsipher et al. ........................ | 307/603 |
| 5,126,691 | 6/1992 | Mijuskovic et al. ..................... | 331/1 A |
| 5,274,678 | 12/1993 | Ferolito et al. ........................... | 375/108 |
| 5,357,146 | 10/1994 | Heimann .................................. | 307/269 |
| 5,471,176 | 11/1995 | Henson et al. ........................... | 331/1 A |
| 5,561,692 | 10/1996 | Maitland et al. ........................ | 375/371 |

*Primary Examiner*—Jeffrey Zweizig
*Attorney, Agent, or Firm*—Schmeiser, Olsen & Watts; Robert A. Walsh

[57] ABSTRACT

A glitch free delay line multiplexing technique is described that includes an intermediate multiplexing system and an output multiplexer. The intermediate multiplexing system receives signals from a plurality of delay units and outputs a subset of delay signals that includes the signal presently selected, the signal presently selected with an additional delay, and the signal presently selected with one less delay. The intermediate multiplexing system receives a control word from a select mechanism in a non-time critical manner. The output multiplexer receives the least significant bits of the control word and outputs the selected signal.

16 Claims, 4 Drawing Sheets

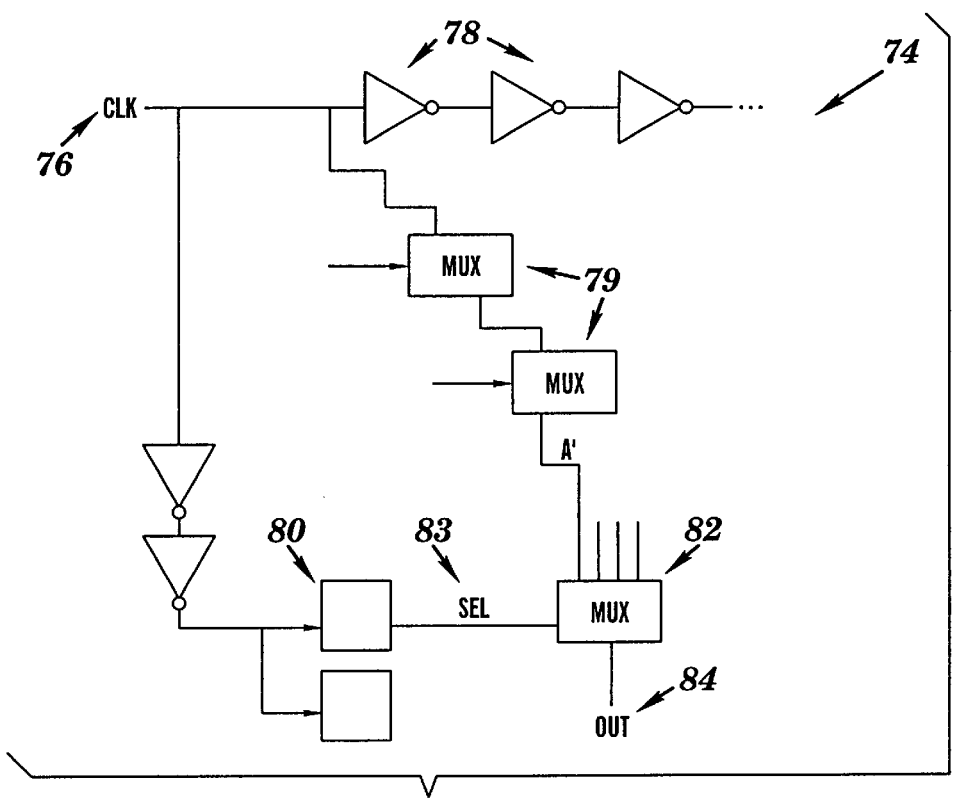
FIG. 5
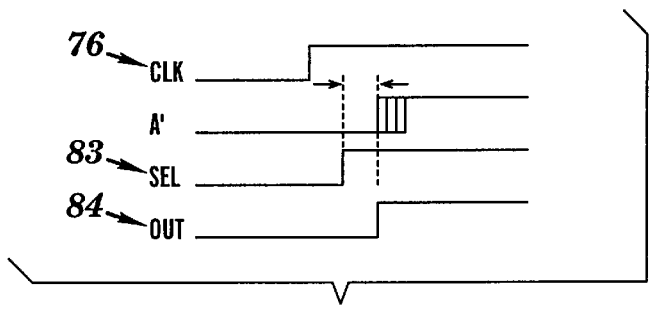
FIG. 6
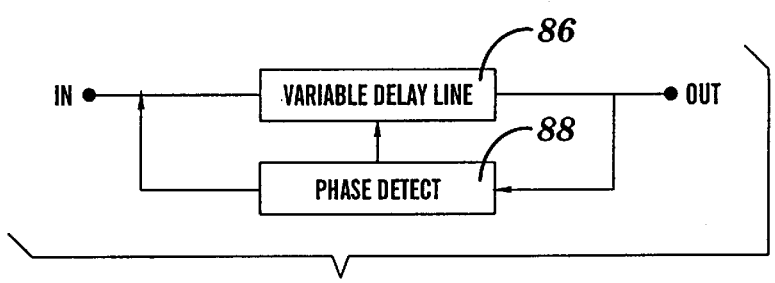
FIG. 7 *PRIOR ART*

GLITCH FREE DELAY LINE MULTIPLEXING TECHNIQUE

BACKGROUND OF THE INVENTION

1. Field of the Invention

This invention relates to variable delay lines, and more particularly relates to a circuit technique to avoid glitches from a variable delay line.

2. Description of Related Art

Digital delay lock loops (DLL's), such as the one shown in FIG. 7, typically employ a variable delay line 86 and phase detect mechanism 88. The variable delay line is generally constructed with delay units and multiplexers in order to provide a clock signal with varying amounts of delay. The amount of delay may be chosen by selectively tapping off the outputs of the delay units and feeding the signals into a multiplexer tree. For example, referring to FIG. 3, a variable delay line 60 is shown that includes a clock signal 62, delay units 64 comprised of inverter gates, a select mechanism 68, a multiplexer (i.e., MUX) 66, and an output 70. According to this example, if the desired output 70 is signal A, which in this case is a clock signal 62 with no delay, the select mechanism 68 outputs a select signal SEL of "0" to the multiplexer 66. This causes the multiplexer 66 to output clock signal 62. Alternatively, if signal B is desired at output 70, the select mechanism 68 sends a select signal SEL of value "1" to multiplexer 66 which will allow signal B to pass to output 70. Signal B comprises clock signal 62 with a predetermined amount of delay caused by the inverters 64. Unfortunately, under this known system, depending on the timing relationship between the delay line input clock signal 62 and the multiplexer select signals, a glitch can occur at the output 70 of the variable delay line 60.

For example, referring to FIG. 4, which depicts the timing diagram of variable delay line 60, it can be seen that in the case where the select mechanism 68 switches multiplexer 66 from signal A to signal B, it is possible that the select signal SEL may arrive at the multiplexer 66 after signal A but before signal B. The result in output signal 70 is a glitch 72 which can have a harmful effect on the system and operations being performed. Therefore, without some improved mechanism for eliminating glitches in variable delay lines, potential errors will be unavoidable.

SUMMARY OF THE INVENTION

The present invention seeks to avoid the limitations and drawbacks of prior art variable delay lines by providing a variable delay line circuit that is glitch free. The improved circuit comprises delay units for receiving a clock signal and providing M delayed clock signals, an intermediate multiplexing system (or filter means) for receiving the M signals and outputting a subset of the M signals, and an output multiplexer that receives the subset of signals and outputs a clock signal with a selected amount of delay n, where n refers to one of the M delayed clock signals. Choosing the clock signal with delay n is done with a selection mechanism. The selection mechanism passes a control word to the intermediate multiplexer system and passes the least significant bits (LSB's) of the control word to the output multiplexer.

The subset of the M signals received by the output multiplexer includes the selected clock signal having a delay of n, a clock signal with one additional delay n+1, and a clock signal with one less delay n−1. All remaining signals from the subset are not relevant and therefore designated as "don't care" signals. According to the sequential nature of a variable delay line, if a signal with a delay of n is presently selected, the subsequent selection must be a signal with the same delay n, a delay of n+1, or a delay of n−1. This invention takes advantage of this sequential operation by preselecting the n+1 and n−1 signals while selecting n. The preselected signals are then made available ahead of time to the output multiplexer.

Because the output multiplexer need only handle a subset of the M signals, the selected signal n can be selected from the output multiplexer with only the least significant bits of the control word. Accordingly, only the least significant bits are timing critical relative to the clock signal. Conversely, the higher order control bits are not timing critical, and need not be stable before the arrival of the clock signal to the input of the output multiplexer.

It is therefore an advantage of the present invention to provide a delay lock loop that employs a glitch free delay line.

It is therefore a further advantage of the present invention to provide an intermediate multiplexer system that outputs a subset of the available delay line signals to include preselected signals that will be utilized during a subsequent clock cycle.

It is therefore a further advantage of the present invention to provide an output multiplexer that requires only the least significant bits of a control word to select the output signal.

The foregoing and other objectives, features, aspects, and advantages of the present invention may be more fully appreciated by considering the following detailed description and claims.

BRIEF DESCRIPTION OF THE DRAWINGS

FIG. 5 depicts a circuit diagram in accordance with a preferred embodiment of the present invention;

FIG. 6 depicts a timing diagram for the circuit depicted in FIG. 5; and

FIG. 7 depicts a delay lock loop.

DESCRIPTION OF THE PREFERRED EMBODIMENTS

Figure 1:
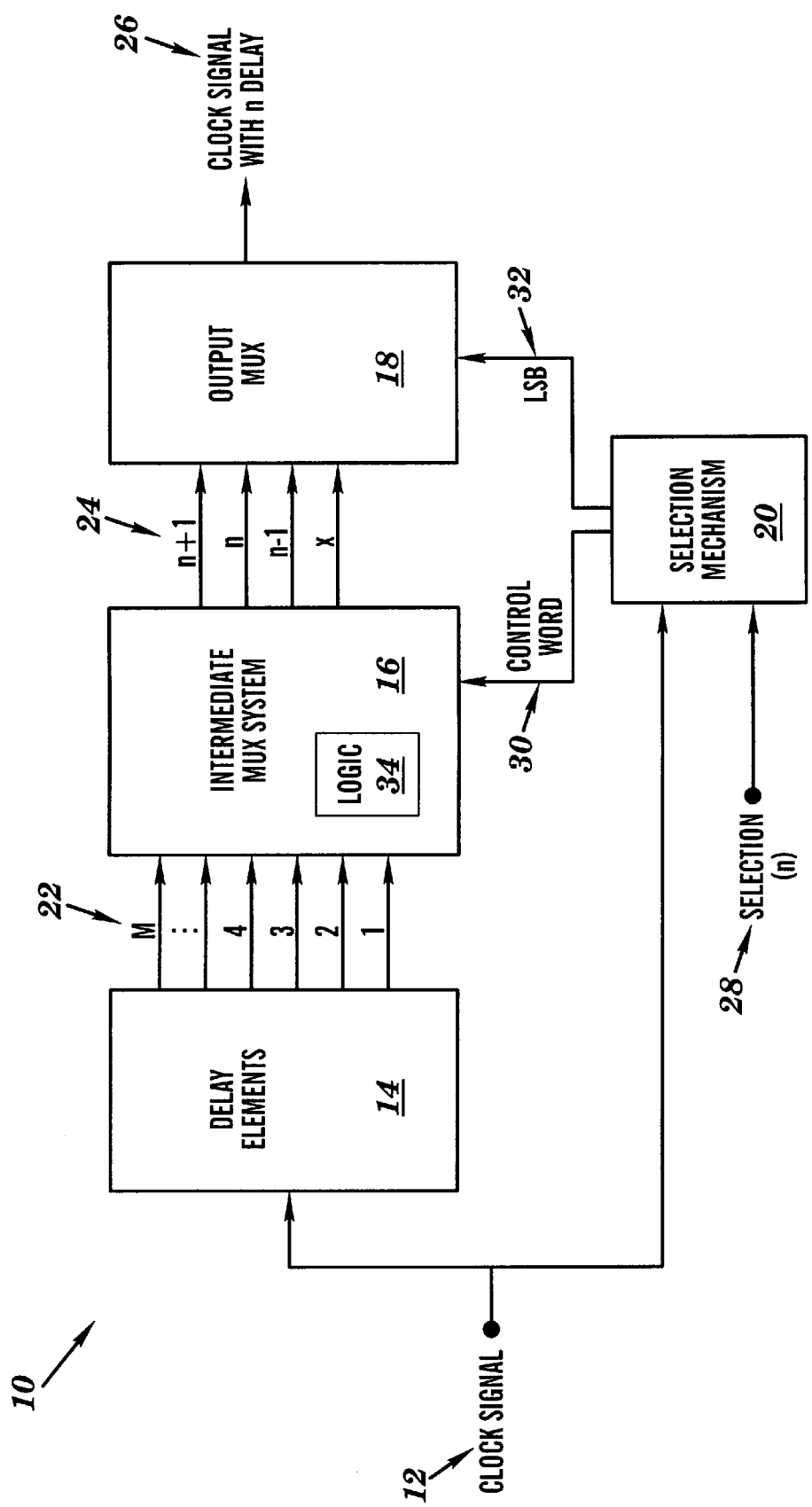
FIG. 1 depicts a block diagram of a variable delay line in accordance with a preferred embodiment of the present invention.

Referring now to the drawings, FIG. 1 depicts a variable delay line 10 that receives clock signal 12 and includes a plurality of delay elements 14 for outputting a plurality of M delay signals 22. The circuitry further comprises an intermediate multiplexer system 16 (or filter means) that receives a control word 30 from selection mechanism 20 and outputs a subset 24 of the M delayed clock signals 22. The selection mechanism 20 includes an input for receiving a selection signal 28 for requesting a clock signal with n delay, which corresponds to the $n^{th}$ one of the M delayed clock signals 22. The selection mechanism 20 passes this selection information to the intermediate multiplexing system 16 in the form of a control word 30. Intermediate multiplexing system 16 outputs a subset 24 of N delayed clock signals based upon the control word 30 and logic 34. The subset 24 of N delayed clock signals includes the clock signal having a delay of n (the selected signal), the clock signal with a delay of n+1, and the clock signal with a delay of n−1. Any remaining signals in the subset 24 of N delayed clock signals are "don't care" signals. The selection mechanism 20 also outputs the least significant bits 32 of control word 30 to the output multiplexer 18. Output multiplexer 18 utilizes the least significant bits 32 to select the clock signal with n delay 26.

In the preferred embodiment, the intermediate multiplexing system 16 is an M-to4 multiplexer and the output multiplexer is a 4-to-1 multiplexer. However, it is recognized that any variations to this configuration fall within the scope of the invention. Accordingly, in the preferred embodiment, the least significant bits 32 of the control word 30 comprise a two bit signal. In general, however, the number of bits required by the output multiplexer 18 is dependent on the size of the subset 24 of N signals. The control word 30 will require as many bits as required to choose one of the N signals.

Figure 2:
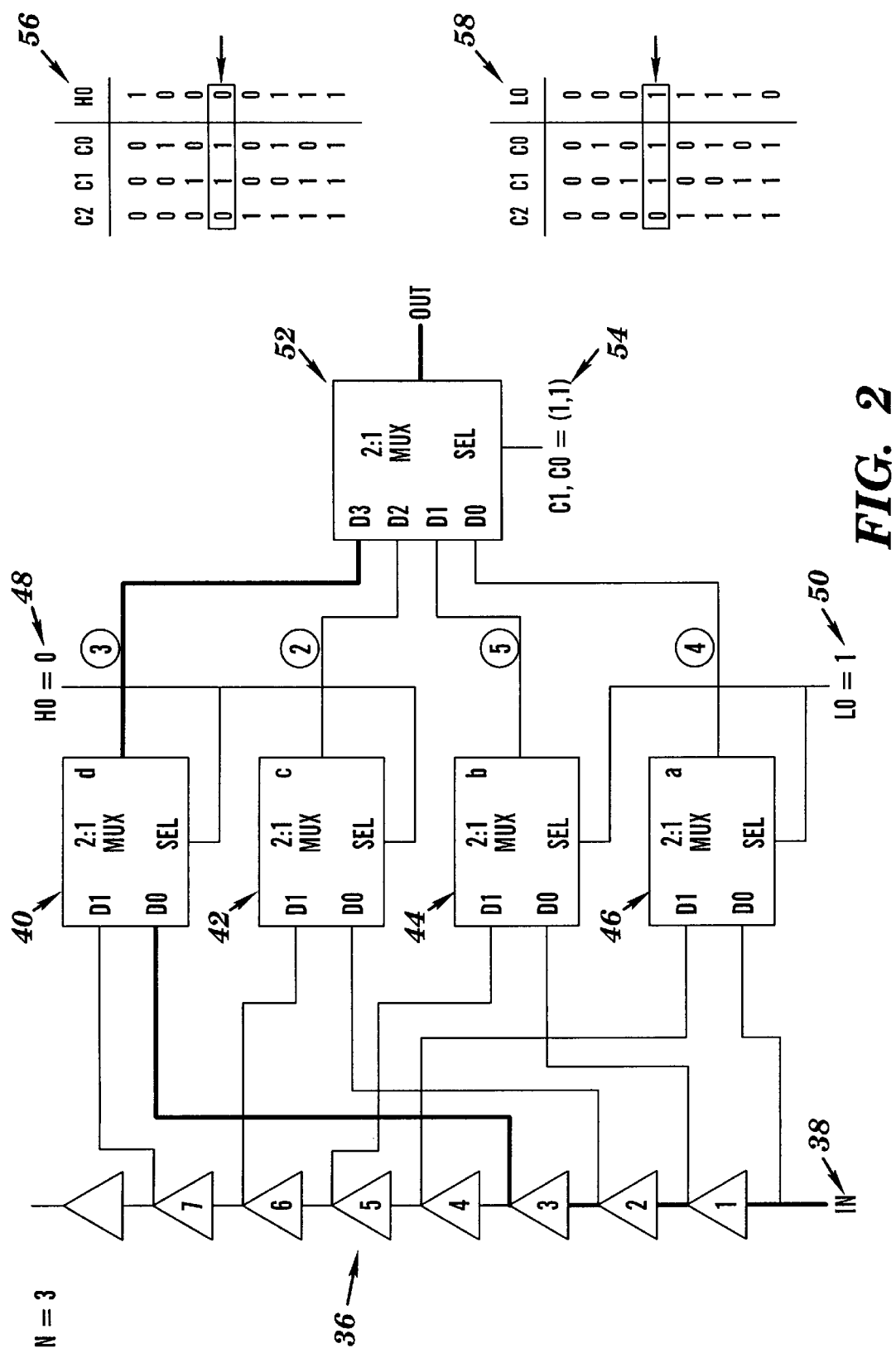
FIG. 2 depicts an eight delay element example circuit diagram in accordance with a preferred embodiment of the present invention.
Figure 3:
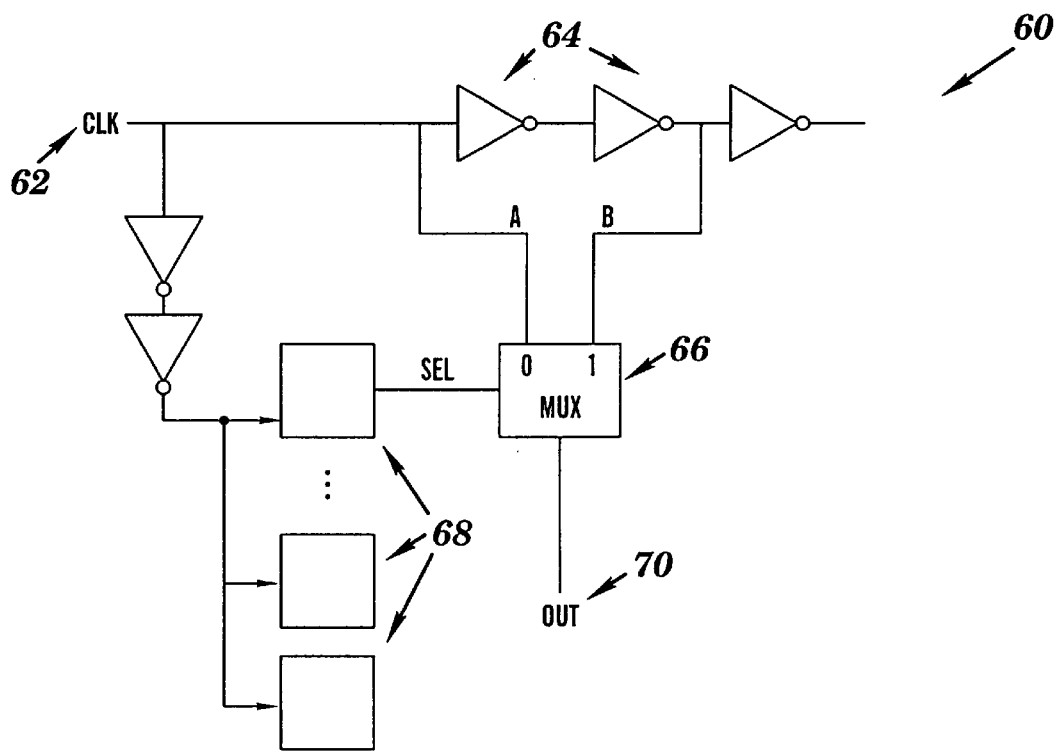
FIG. 3 depicts a circuit diagram of a known delay system.
Figure 4:
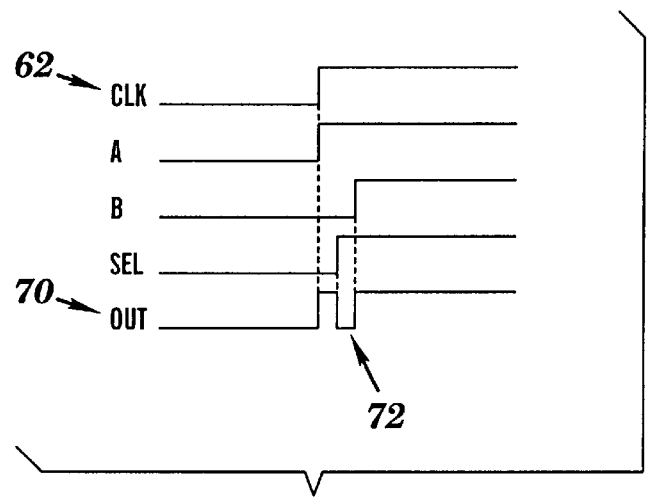
FIG. 4 depicts a timing diagram for the circuit of FIG. 3.

FIG. 2 depicts a preferred embodiment of the invention for an eight-element delay line controlled by a 3 bit control word. The circuit includes a clock signal input 38, a plurality of delay elements 36 for creating eight different clock signals, an intermediate multiplexing system comprised of four 2-to-1 multiplexers 40, 42, 44 and 46, and a 4-to-1 output multiplexer 52. This simple example is used primarily for illustration purpose only, as a real application would likely have many more delay elements (e.g., 128 elements). The invented technique described here, however, can be applied hierarchically for a larger delay line.

According to this example, the selected delay n has one of eight possible values and is encoded in a 3 bit control word (C2,C1,C0). The control word controls the operation of the intermediate multiplexing system. Logic 34 (see FIG. 1) converts the 3 bit control word into a pair of control signals H0 and L0 in accordance with logic tables 56 and 58 respectively. The H0 and L0 signals 48 and 50 cause the intermediate multiplexer system to output the desired subset of four clock signals to the output multiplexer 52. In particular, the subset of signals will have delays of n, n+1, n−1, and "don't care." Output multiplexer 52 also receives a control signal 54 comprised of the two least significant bits of the control word C1 and C0.

The circuit operates as follows. Assume that the selection mechanism (not shown) selects a clock signal with a delay of 3 (i.e, n=3). The control word created by the selection mechanism would be comprised of a 3 bit control word value (C2,C1,C0)=011 and the control signals H0 and L0 would be calculated as 0 and 1 respectively. 2-to-1 multiplexer 40 would allow the signal from the third delay unit (n=3) to pass to input D3 of the output multiplexer 52. The signal appearing at input D3, which is the selected signal, is chosen by the output multiplexer using the least significant bits of the control word, namely (C1,C0)=11. The remaining signals D0, D1 and D2 will contain the necessary preselected signals for the next clock cycle.

As noted above, according to the sequential nature of the variable delay line, the choice of delays during a subsequent clock cycle must be either n, n+1 or n−1, which in this case correspond to delay units 3, 4 or 2, respectively. Thus, the next control word therefore must be 011 (i.e., n=3), 010 (i.e., n−1=2) or 100 (i.e., n+1=4). As described above, input D3 will already contain the signal corresponding to n=3. Similarly, input D2 will contain the signal from the second delay unit (i.e., n−1), and input D0 will contain the signal from the fourth delay unit (i.e., n+1). Input D1 will contain the signal from the delay unit five. Because the signal from delay unit five will not be needed in the next clock cycle, D1 will be designated as "don't care." Accordingly, output multiplexer 52 will, in addition to providing the selected signal, always be receiving the three signals that could possibly be needed during the subsequent clock cycle.

For example, in the case where the subsequent control word is 100, the 4-to-1 multiplexer 52 would select D0 based upon the control words LSB's of 00. According to the logic tables 56 and 58, neither L0 nor H0 would be changed during the transition. Thus, D0 would contain the signal from the fourth delay unit already preselected by the 2-to-1 multiplexer 46. For the case where the subsequent control word is 010, the 4-to-1 multiplexer 52 would select D2 based upon D the control words LSB's of 10. D2 would contain the signal from the second delay unit already preselected by the 2-to-1 multiplexer 42. Note that this transition also causes a change in the preselection of the D1 input to have a clock signal with a one unit delay such that D1 will be the n−1 signal of the current selection (i.e., L0 changes from 1 to 0).

As noted, the timing of the preselection activities in the intermediate multiplexers is not critical. Although the timing of the output multiplexer is critical, only the LSB's are required to control the output, thereby further ensuring that the control signal to the output multiplexer will arrive before the newly selected delayed clock signal.

Referring now to FIG. 5, a variable delay line 74 in accordance with the present invention is depicted and is comprised of a clock signal 76, delay units 78, an intermediate multiplexing system 79, a select mechanism 80, an output multiplexer 82, and an output signal 84. According to this invention, the select signal 83 generated from the select mechanism 80 will always arrive at the output multiplexer 82 prior to signal A' and therefore eliminate glitches. Thus, referring to timing diagram of FIG. 6, it can be seen that the select signal 83 will always arrive at the output multiplexer 82 prior to the A' signal since the A' signal must first make its way through the intermediate multiplexing system 79. The result is a system in which there are no glitches.

The foregoing description of the preferred embodiment of this invention has been presented for the purposes of illustration and description. It is not intended to be exhaustive or to limit the invention to the precise form disclosed and obviously many modifications and variations are possible in light of the above teachings. Such modification and variations that may be apparent to a person skilled in the art are intended to be included within the scope of this invention as defined by the accompanying claims.

I claim:

1. A glitch free delay line system comprising:
   a clock signal;
   a variable delay line comprising a plurality of sequentially coupled delay units, wherein the delay line comprises M output nodes and each of the M output nodes reproduces the clock signal with a varying amount of delay;
   a select mechanism for choosing a predetermined amount of delay n, and for generating a selection signal in response thereto;
   an M-to-N multiplexor having:
   M inputs for receiving each of the delayed clock signals from the M output nodes,
   a select input for receiving the selection signal from the select mechanism, and
   N output lines, wherein 3<N<M, and wherein three of the N output lines provide clock signals having delays of n, n−1, and n+1; and an N-to-1 multiplexor having:
  N inputs coupled to the N output lines of the M-to-N multiplexor,
  a select input for receiving the selection signal from the select mechanism, and
  an output line, wherein the output line outputs the clock signal with n delay.

2. The system of claim 1 wherein the N output lines further provide a signal having a delay of "don't care."

3. The system of claim 1 wherein the select mechanism is synchronized with the clock signal.

4. The system of claim 1 wherein N equals four.

5. The system of claim 1 wherein the select input of the N-to-1 multiplexor receives only a portion of the selection signal.

6. The system of claim 1 wherein the M-to-N multiplexor includes combinatorial logic for choosing the appropriate M output nodes based on the selection signal in order to provide the three clock signals having delays of n, n−1, and n+1.

7. A glitchless delay line circuit, comprising:
  delay means for generating a plurality of delayed clock signals;
  selection means for selecting one of the plurality of delayed clock signals, the selected clock signal having a delay of n;
  filter means for generating a subset of delayed clock signals, wherein the subset includes clock signals having delays of n, n+1 and n−1; and
  output means for receiving the subset of delayed clock signals and for generating the clock signal having n delay.

8. The circuit of claim 7 wherein the selection means comprises:
  means for delivering a first signal to the filter means; and
  means for delivering a second signal to the output means, wherein the second signal comprises a portion of the first signal.

9. The circuit of claim 8 wherein the second signal reaches the output means before the subset reaches the output means.

10. A delay lock loop comprising:
  a phase detection system; and
  a variable delay line, comprising:
    a plurality of delay units for generating a plurality of delayed clock signals, wherein each has a varying amount of delay;
    a selection mechanism for selecting the clock signal having n delay;
    a filter mechanism for generating a subset of delayed clock signals, wherein the subset includes clock signals having delays of n, n+1 and n−1; and
    an output mechanism for receiving the subset of delayed clock signals and for generating the clock signal having n delay.

11. The delay lock loop of claim 10 wherein the selection mechanism delivers a control word to the filter mechanism and delivers a portion of the control word to the output mechanism.

12. The delay lock loop of claim 11 wherein the portion of the control word affects the output mechanism before the subset affects the output mechanism.

13. A delay line circuit, comprising:
  a delay system for generating a plurality of delayed clock signals;
  a selection system for selecting one of the plurality of delayed clock signals, the selected clock signal having a delay of n;
  a filter system for generating a subset of delayed clock signals, wherein the subset includes clock signals having delays of n, n+1 and n−1; and
  an output system for receiving the subset of delayed clock signals and for generating the clock signal having n delay.

14. The circuit of claim 13 wherein the selection system comprises:
  a system for delivering a first signal to the filter system; and
  a system for delivering a second signal to the output means, wherein the second signal comprises a portion of the first signal.

15. The circuit of claim 14 wherein the second signal reaches the output system before the subset reaches the output system.

16. A method for generating a glitch free delayed clock signal, comprising the steps of:
  generating a plurality of delayed clock signals;
  selecting one of the plurality of delayed clock signals, the selected clock signal having a delay of n;
  generating a subset of delayed clock signals, wherein the subset includes clock signals having delays of n, n+1 and n−1; and
  receiving the subset of delayed clock signals and generating the clock signal having n delay.

* * * * *